United States Patent
Okuda

(10) Patent No.: US 8,085,094 B2
(45) Date of Patent: Dec. 27, 2011

(54) HIGH FREQUENCY AMPLIFIER

(75) Inventor: Toshio Okuda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/873,344

(22) Filed: Sep. 1, 2010

(65) Prior Publication Data

US 2011/0169576 A1    Jul. 14, 2011

(30) Foreign Application Priority Data

Jan. 12, 2010 (JP) .................................. 2010-004272

(51) Int. Cl.
*H03F 3/04* (2006.01)
(52) U.S. Cl. ...................................... 330/286; 330/307
(58) Field of Classification Search .................. 330/307, 330/286, 192, 302
See application file for complete search history.

(56) References Cited

U.S. PATENT DOCUMENTS

| 6,081,694 A | 6/2000 | Matsuura et al. |
| 7,656,228 B2 | 2/2010 | Fukuda et al. |
| 7,825,731 B2 * | 11/2010 | Ohnishi et al. ................ 330/286 |

FOREIGN PATENT DOCUMENTS

| JP | 9-186533 A | 7/1997 |
| JP | 10-126173 A | 5/1998 |
| JP | 11-127040 A | 5/1999 |
| JP | 2008-113202 A | 5/2008 |

* cited by examiner

*Primary Examiner* — Hieu Nguyen
(74) *Attorney, Agent, or Firm* — Leydig, Voit & Mayer, Ltd.

(57) ABSTRACT

A high frequency amplifier includes a package substrate, an amplifying active device disposed on a top surface of the package substrate, a transmission line connected to the amplifying active device and transmitting a high frequency signal, a surface mounted device (SMD) component shunt-connected at a first end to the transmission line, a SMD component terminal connected to a second end of the SMD component and partially exposed at a back surface of the package substrate, and an external terminal partially exposed at the back surface of the package substrate and connected to a first end of the transmission line, opposite a second end of the transmission line that is connected to the amplifying active device.

3 Claims, 6 Drawing Sheets

HIGH FREQUENCY AMPLIFIER

BACKGROUND OF THE INVENTION

1. Field of the Invention

The present invention relates to a high frequency amplifier used in cellular phones and S- and C-band wireless communications.

2. Background Art

In cellular phone and S- and C-band wireless communication networks, each coverage area is assigned a particular frequency, or frequency band, which can be used by communication devices. However, communication device manufacturers desire to avoid manufacture of a different high frequency amplifier for each such assigned frequency, since this complicates the management of the manufacturing process. Therefore, some high frequency amplifiers are designed to be operable in a plurality of frequency bands.

A known such high frequency amplifier will be described with reference to FIG. 13. In the high frequency amplifier shown in FIG. 13, the signal which has been amplified by an amplifying active device 12 is passed through a transmission line to the output terminal. Further in this high frequency amplifier, chip capacitors 21 and 51 are shunt-connected to the transmission line for matching purposes. A chip inductor and a diode 52 are connected to the chip capacitor 51. It should be noted that the diode 52 can be turned on and off by selectively controlling the application of the voltage from a terminal 53. That is, the chip capacitor 51 can be electrically connected to and disconnected from ground by turning on and off the diode 52. This allows the impedance of the high frequency amplifier to be set to two values to achieve the optimum matching conditions in two different frequency bands.

Thus, in some conventional high frequency amplifiers, a chip capacitor, etc. can be connected to and disconnected from ground by use of an active device such as a diode so that these amplifiers can be operated in a plurality of frequency bands . Further, high frequency amplifiers capable of amplifying signals in a plurality of frequency bands are described in Japanese Laid-Open Patent Publication Nos. 11-127040 (1999), 09-186533 (1997), 10-126173 (1998), and 2008-113202.

As described above, in order to be operated in a plurality of frequency bands, a high frequency amplifier must include an active device and a circuit for controlling it, resulting in an increased parts count. (The term "control circuit" is hereinafter used to refer collectively to the active device and the circuit for controlling it, which device is used to change the matching conditions of the high frequency amplifier.)

Further, such high frequency amplifiers are also disadvantageous in that powering the additional control circuit results in a decrease in the overall operating efficiency.

SUMMARY OF THE INVENTION

The present invention has been made to solve the above problems. It is, therefore, an object of the present invention to provide a high frequency amplifier operable in a plurality of frequency bands without need for an additional control circuit for changing the matching conditions of the amplifier.

According to one aspect of the present invention, a high frequency amplifier includes a package substrate, an amplifying active device disposed on a top surface of the package substrate, a transmission line connected to the amplifying active device and transmitting a high frequency signal, an SMD component shunt-connected at one end to the transmission line, an SMD component terminal connected to the other end of the SMD component and partially exposed at a back surface of the package substrate, and an external terminal partially exposed at the back surface of the package substrate and connected to the end of the transmission line opposite the end connected to the amplifying active device.

According to another aspect of the present invention, a high frequency amplifier includes a package substrate, an amplifying active device disposed on a top surface of the package substrate, a first transmission line formed on the package substrate so that the first transmission line is connected in series with the amplifying active device, a second transmission line formed on the package substrate so that the second transmission line is connected in series with the amplifying active device, a first connecting terminal connected to the first transmission line and partially exposed at a back surface of the package substrate, and a second connecting terminal connected to the second transmission line and partially exposed at the back surface of the package substrate.

Other and further objects, features and advantages of the invention will appear more fully from the following description.

DETAILED DESCRIPTION OF THE PREFERRED EMBODIMENTS

First Embodiment

Figure 1:
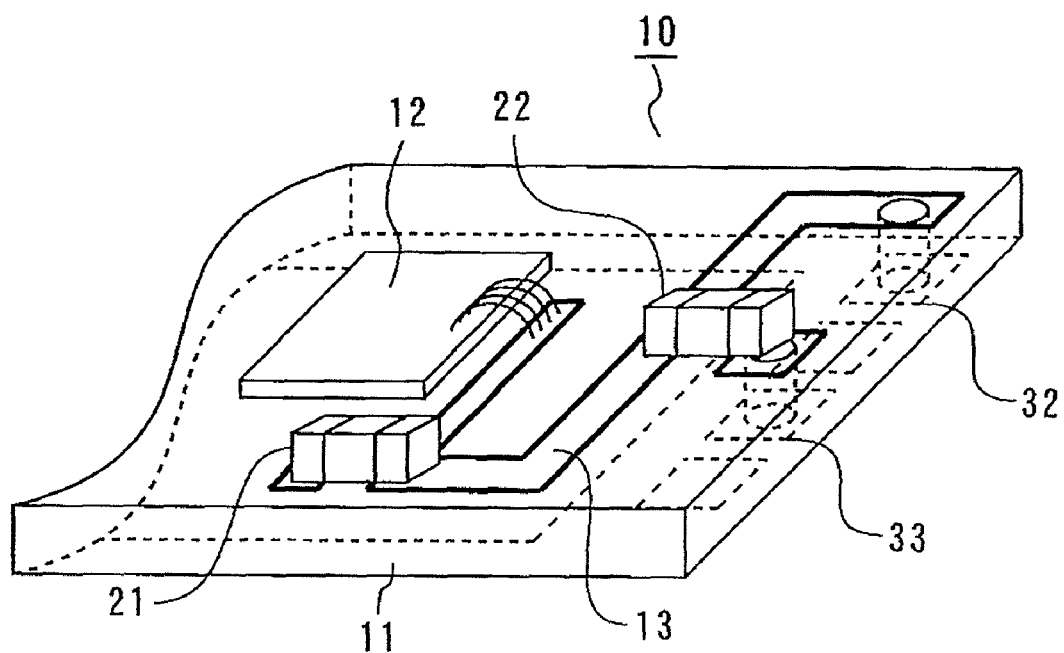
FIG. 1 is a perspective view of a high frequency amplifier of the first embodiment.

A first embodiment of the present invention will be described with reference to FIGS. 1 to 8. It should be noted that throughout the description of the first embodiment, certain of the same or corresponding components are designated by the same reference numerals and described only once. This also applies to other embodiment of the invention subsequently described.

FIG. 1 is a perspective view of a high frequency amplifier 10 of the present embodiment. In FIG. 1, the dashed lines indicate internal features of the high frequency amplifier 10. The following description of the present embodiment will be directed to the output matching of the high frequency amplifier, which matching significantly affects the high frequency characteristics of the amplifier. The high frequency amplifier 10 includes a package substrate 11. The package substrate 11 is, e.g., a double-sided single-layer resin substrate. An amplifying active device 12 is mounted on the top surface of the package substrate 11. The amplifying active device 12 is connected to a transmission line 13 by wire bonding, etc. The transmission line 13 is a circuit pattern formed on the top surface of the package substrate 11.

The terminal end of the transmission line 13 serves as an output end and is connected to an external output terminal 32. As can be seen from FIG. 1, the external output terminal 32 is partially exposed at the back surface of the package substrate 11. SMD components 21 and 22 are shunt-connected to the portion of the transmission line 13 extending from the amplifying active device 12 to the output end. The SMD components 21 and 22 are chip capacitors or chip inductors. The SMD component 21 is connected at one end to the transmission line 13 and at the other end to a ground portion. The SMD component 22 is connected at one end to the transmission line 13 and at the other end to an SMD component terminal 33. The SMD component terminal 33 is partially exposed at the back surface of the package substrate 11.

Figure 2:
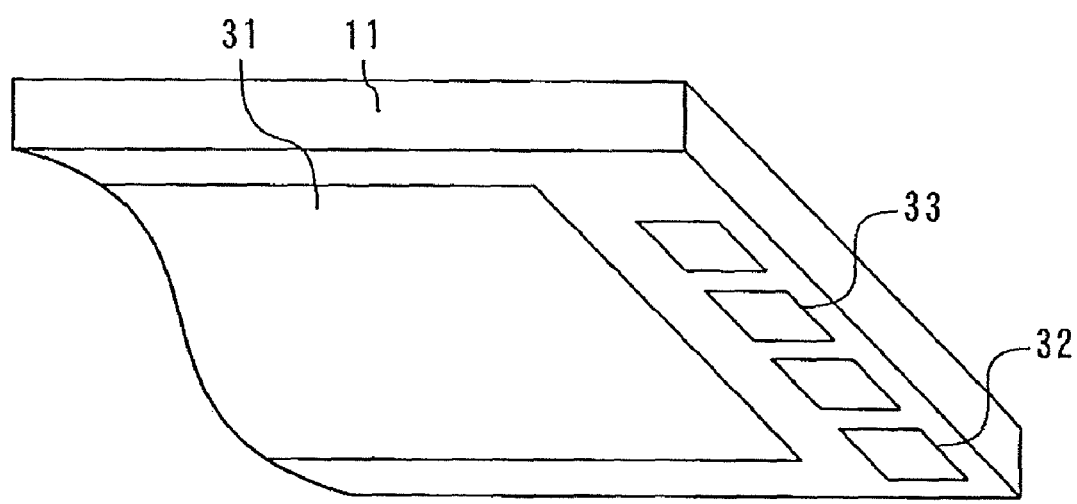
FIG. 2 is a diagram of the high frequency amplifier as viewed from its back side.

FIG. 2 is a diagram of the high frequency amplifier 10 as viewed from its back side. As can be seen from FIG. 2, both the external output terminal 32 and the SMD component terminal 33 are exposed at the back surface of the package substrate 11. The external output terminal 32 and the SMD component terminal 33 are arranged along an edge of the package substrate 11. Further, a mounting portion 31 is formed on the back surface of the package substrate 11.

Figure 3:
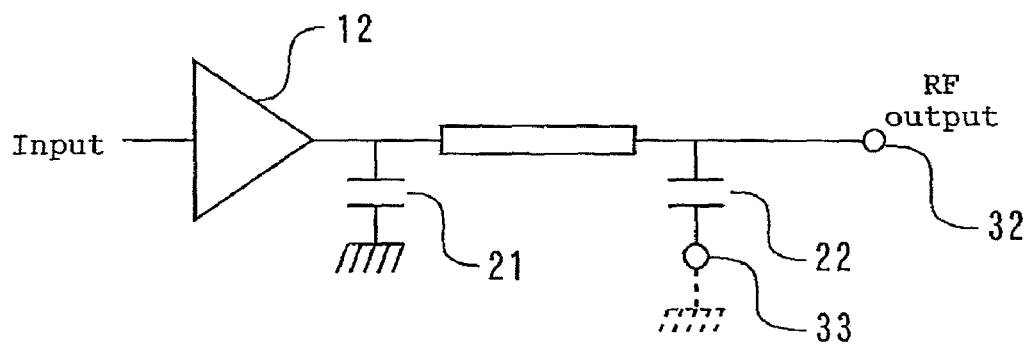
FIG. 3 is an equivalent circuit diagram of the high frequency amplifier of the first embodiment.

FIG. 3 is an equivalent circuit diagram of the high frequency amplifier 10 constructed as described above. Since the SMD component terminal 33 is connected or unconnected to ground (as described later), the connection of the terminal to ground is indicated by a dashed line in FIG. 3.

The high frequency amplifier 10 is mounted on the mounting board of a communication device, etc. Specifically, the high frequency amplifier 10 is mounted on the mounting board so that the back surface of the amplifier is in contact with the top surface of the board which has patterns formed thereon.

Figure 4:
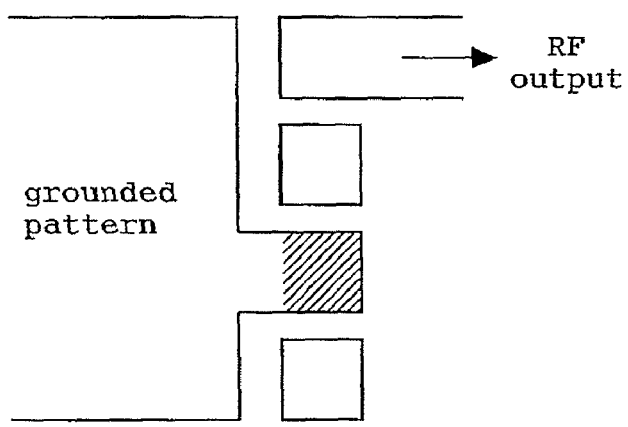
FIG. 4 shows a circuit pattern formed on a mounting board.
Figure 5:
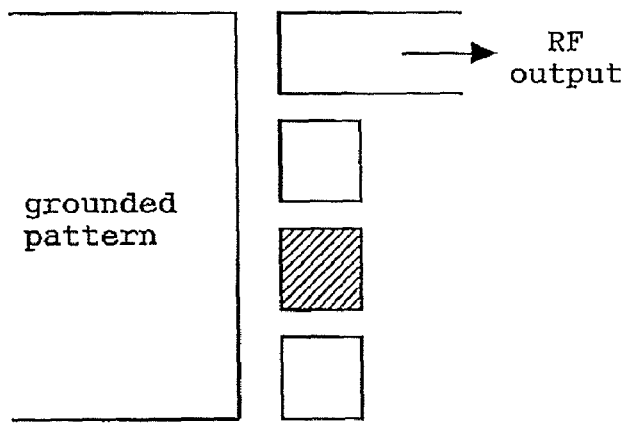
FIG. 5 shows other circuit pattern formed on a mounting board.

FIGS. 4 and 5 show exemplary patterns formed on the surfaces of mounting boards which are adapted to have the high frequency amplifier 10 mounted thereon. The shaded portions in FIGS. 4 and 5 represent the locations where the SMD component terminal 33 is mounted on the mounting boards. The portions indicated by the reference symbol RFoutput in FIGS. 4 and 5, on the other hand, represent the locations at which the external output terminal 32 is mounted. Mounting the high frequency amplifier 10 on the mounting board shown in FIG. 4 results in the SMD component terminal 33 being grounded, so that the high frequency amplifier 10 amplifies the incoming RF signal at a frequency f1. On the other hand, mounting the high frequency amplifier 10 on the mounting board shown in FIG. 5 results in the SMD component terminal 33 being unconnected to ground, so that the high frequency amplifier 10 amplifies the incoming RF signal at a frequency f2 (different from the frequency f1).

Figure 6:
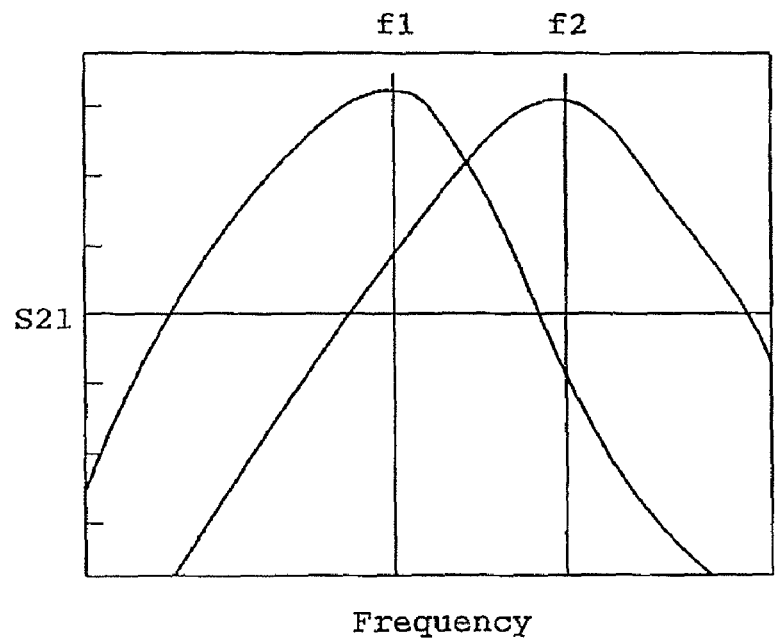
FIG. 6 shows the S21 characteristics (or transmission characteristics) of the high frequency amplifier.
Figure 7:
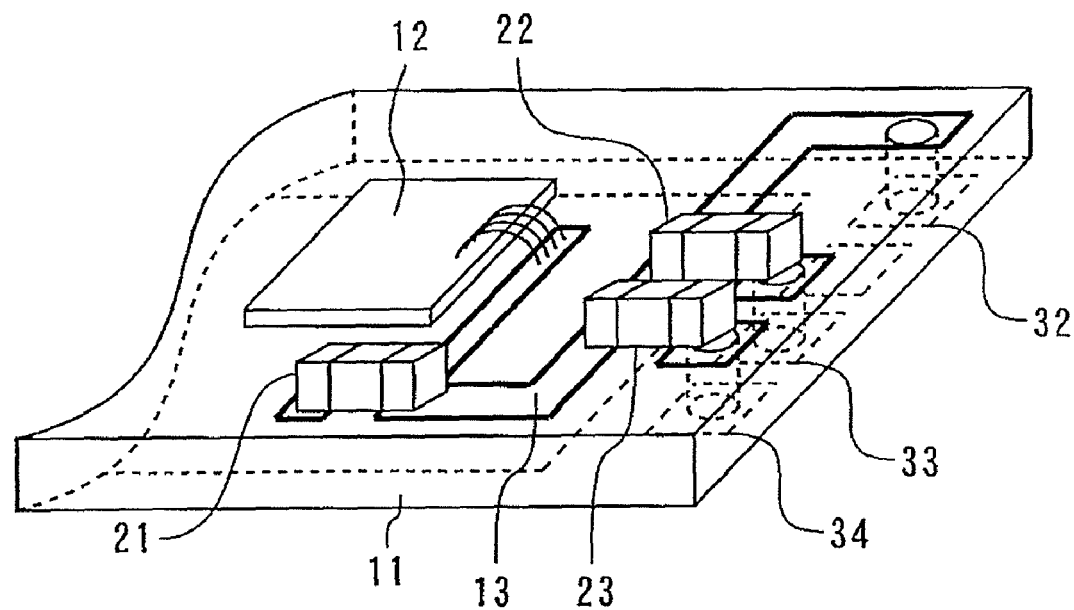
FIG. 7 is a perspective view of a high frequency amplifier including two SMD components.

FIG. 6 shows the S21 characteristics (or transmission characteristics) of the high frequency amplifier 10 when the amplifier amplifies the incoming signal at around the frequency f1 (i.e., when the amplifier is mounted on the mounting board shown in FIG. 4) and when the amplifier amplifies the incoming signal at around the frequency f2 (i.e., when the amplifier is mounted on the mounting board shown in FIG. 5). Thus, the frequency at which the high frequency amplifier 10 amplifies the incoming RF signal can be changed by only slightly changing the pattern on the surface of the mounting board on which the amplifier is mounted. That is, the use of the high frequency amplifier 10 of the present embodiment at a plurality of frequencies eliminates the need to use different high frequency amplifiers for these frequencies. That is, the high frequency amplifier 10 serves as a general-purpose high frequency amplifier. Furthermore, the high frequency amplifier 10 of the present embodiment can be operated in a plurality of frequency bands without requiring an active device and a control circuit therefor to change the matching conditions of the amplifier, that is, without an increase in the parts count. Further, the elimination of the active device also eliminates the need to power the device, preventing a decrease in the overall operating efficiency of the high frequency amplifier 10.

Figure 8:
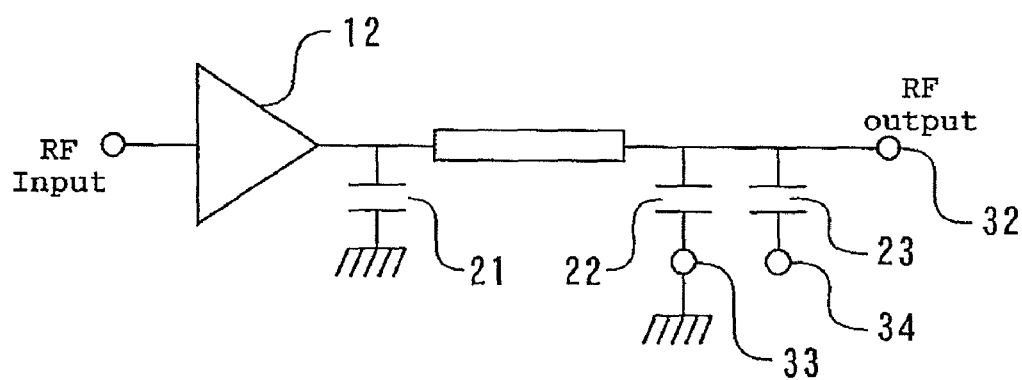
FIG. 8 shows an equivalent circuit of the high frequency amplifier shown in FIG. 7.

Although in the present embodiment only one SMD component can be selectively connected and unconnected to ground, it is to be understood that the present invention is not limited to this particular arrangement. In other embodiments, for example, a plurality of SMD components may be able to be selectively connected and unconnected to ground. A high frequency amplifier including two such SMD components will be described with reference to FIGS. 7 and 8. The high frequency amplifier shown in FIG. 7 differs from the high frequency amplifier 10 described above in that it additionally includes an SMD component 23. This high frequency amplifier also includes an SMD component terminal 34 connected to the SMD component 23 and exposed at the back surface of the package substrate 11. FIG. 8 shows an equivalent circuit of the high frequency amplifier shown in FIG. 7 when the SMD component terminal 33 is connected to ground and the SMD component terminal 34 is unconnected to ground.

The high frequency amplifier may be designed to amplify the incoming signal at different frequencies depending on whether the SMD component terminal 33 or the SMD component terminal 34 is connected to ground on the mounting board of a communication device. Further, both of the SMD component terminals 33 and 34 may be ungrounded, which allows the high frequency amplifier to amplify the incoming signal at a different frequency than when the SMD component terminal 33 or 34 is grounded. Thus, this high frequency amplifier, which includes a plurality of SMD component terminals each connected to an SMD component, can be operated in more frequency bands than the high frequency amplifier 10, which includes only one SMD component terminal connected to an SMD component.

Further, although the present embodiment has been described in connection with the output matching of a high frequency amplifier, it is to be understood that the present invention is not limited to output matching. For example, the present invention may also be applied to input matching, etc., with the same effect. That is, in other embodiments, the terminal end of the transmission line 13 may serve as an input end (or any type of end), and the external output terminal 32 may serve as an external input terminal (or any type of external terminal).

Second Embodiment

Figure 9:
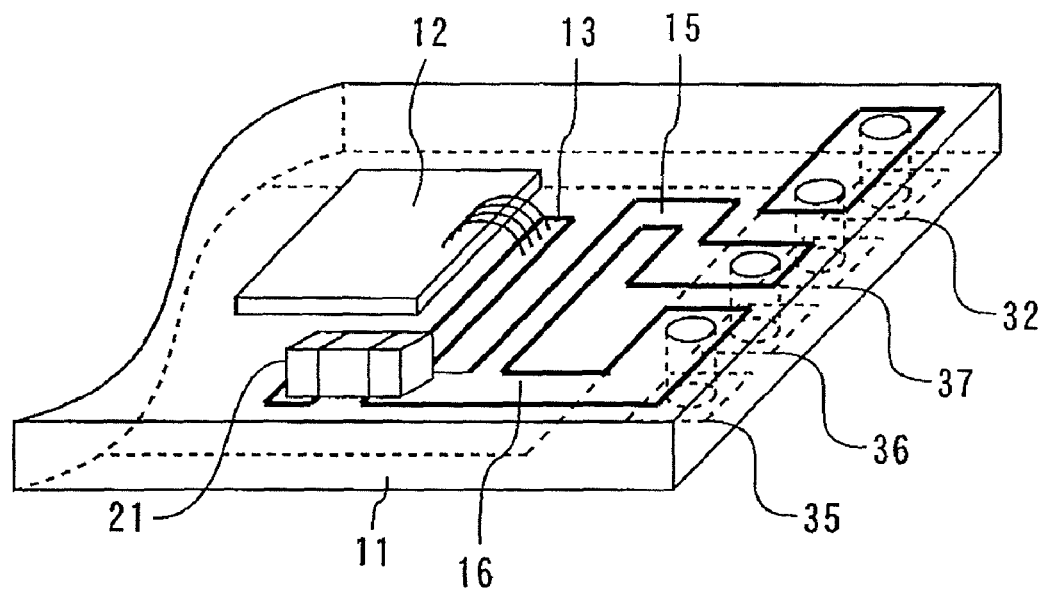
FIG. 9 shows a first transmission line and a second transmission line.

A second embodiment of the present invention will be described with reference to FIGS. 9 to 12. A high frequency amplifier of the present embodiment is constructed such that the frequency at which the amplifier amplifies the incoming RF signal can be changed by changing an inductance component of the amplifier. Referring to FIG. 9, a transmission line 13 includes a first transmission line 15 and a second transmission line 16. The inductance of the first transmission line 15 differs from that of the second transmission line 16. The first transmission line 15 is formed on a package substrate 11 and connected in series with an amplifying active device 12. The first transmission line 15 is also connected to a first connecting terminal 36. The first connecting terminal 36 is partially exposed at the back surface of the package substrate 11.

The second transmission line 16 is formed on the package substrate 11 and connected in series with the amplifying active device 12. The second transmission line 16 is also connected to a second connecting terminal 35. The second connecting terminal 35 is partially exposed at the back surface of the package substrate 11.

Figure 12:
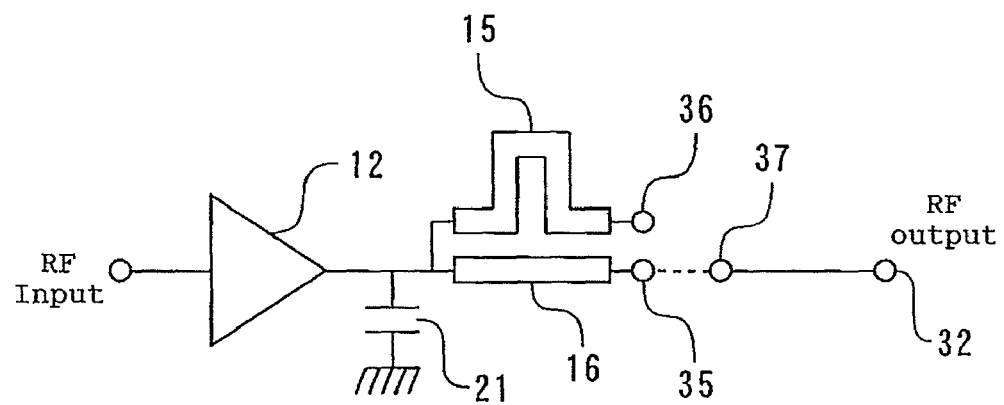
FIG. 12 shows an equivalent circuit diagram of the high frequency amplifier of the second embodiment.
Figure 13:
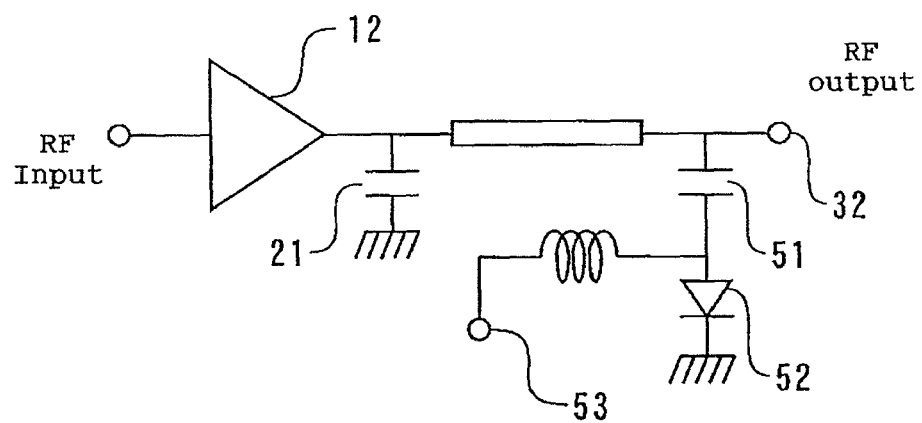
FIG. 13 shows a prior art amplifier.

An external output terminal 32 is connected to a third connecting terminal 37 by a conductor formed on the top surface of the package substrate 11. The third connecting terminal 37 is partially exposed at the back surface of the package substrate 11. That is, the external output terminal 32, the first connecting terminal 36, the second connecting terminal 35, and the third connecting terminal 37 are exposed at the back surface of the package substrate 11 of the present embodiment and spaced from one another. FIG. 12 shows an equivalent circuit of this high frequency amplifier. Like the high frequency amplifier of the first embodiment, the high frequency amplifier of the present embodiment is mounted on the surface of the mounting board of a communication device, etc.

Figure 10:
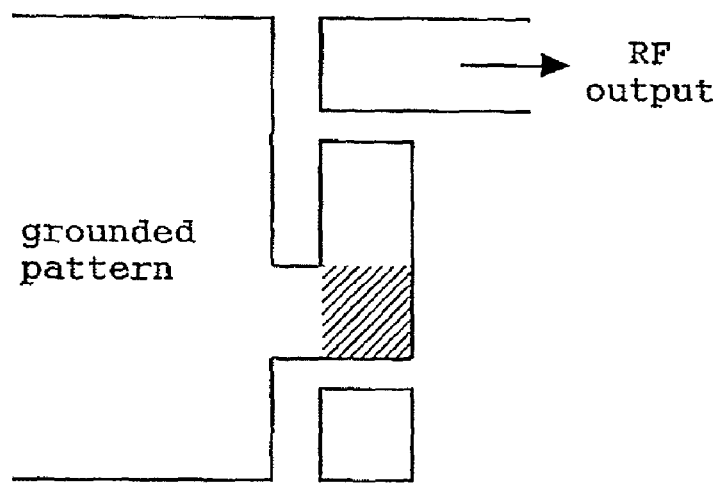
FIG. 10 shows a circuit pattern formed on a mounting board.
Figure 11:
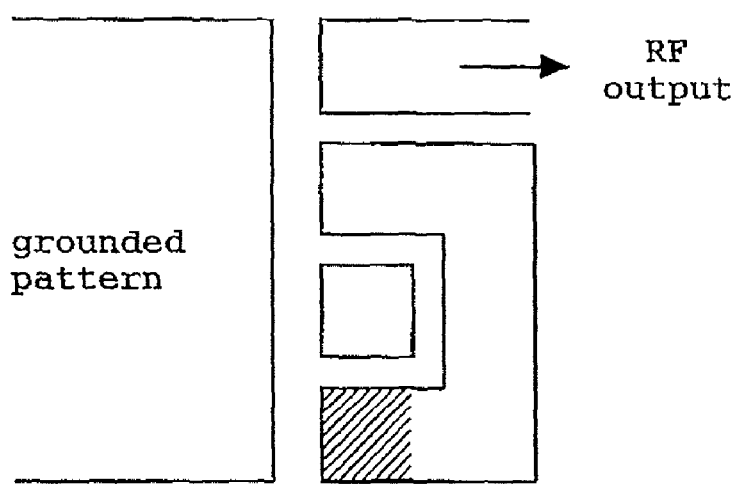
FIG. 11 shows other circuit pattern formed on a mounting board.

FIGS. 10 and 11 illustrate patterns on the surfaces of mounting boards which are adapted to have this high frequency amplifier mounted thereon. Mounting the high frequency amplifier on the mounting board shown in FIG. 10 results in the first connecting terminal 36 being connected to the external output terminal 32 through the third connecting terminal 37. That is, the RF signal passes through the first transmission line 15. It will be noted that the shaded portion in FIG. 10 represents the location where the first connecting terminal 36 is in contact with the pattern.

On the other hand, mounting the high frequency amplifier on the mounting board shown in FIG. 11 results in the second connecting terminal 35 being connected to the external output terminal 32 through the third connecting terminal 37. That is, the RF signal passes through the second transmission line 16. It will be noted that the shaded portion in FIG. 11 represents the location where the second connecting terminal 35 is in contact with the pattern. Thus, the RF signal passes through the first transmission line 15 or the second transmission line 16 depending on whether the high frequency amplifier is mounted on the mounting board shown in FIG. 10 or 11, since these mounting boards have suitable different patterns formed thereon. This allows for the same effect as described in connection with the first embodiment.

Further, since in the high frequency amplifier of the present embodiment the first connecting terminal 36 and the second connecting terminal 35 are disposed adjacent each other, it is easy to design the connecting wiring on the mounting boards on which the amplifier is to be mounted.

The present invention enables the manufacture of a high frequency amplifier which is simple in construction yet can be operated in a plurality of frequency bands.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-004272, filed on Jan. 12, 2010 including specification, claims, drawings and summary, on which the Convention priority of the present application is based, are incorporated herein by reference in its entirety.

What is claimed is:

1. A high frequency amplifier comprising:
    a package substrate;
    an amplifying active device disposed on a top surface of said package substrate;
    a transmission line connected to said amplifying active device and transmitting a high frequency signal;
    a surface mounted device (SMD) component shunt-connected at a first end of said SMD component to said transmission line;
    a SMD component terminal connected to a second end of said SMD component and partially exposed at a back surface of said package substrate; and
    an external terminal partially exposed at said back surface of said package substrate and connected to a first end of said transmission line, opposite a second end of said transmission line that is connected to said amplifying active device.

2. The high frequency amplifier according to claim 1, further comprising a plurality of said SMD components and a plurality of said SMD component terminals, equal in number to said SMD components, wherein each of said SMD components is connected to or associated with a different one of said SMD component terminals.

3. The high frequency amplifier according to claim 1, wherein said SMD component terminal and said external terminal are disposed adjacent each other.

* * * * *